United States Patent
Kuo et al.

(10) Patent No.: US 6,559,010 B1
(45) Date of Patent: May 6, 2003

(54) METHOD FOR FORMING EMBEDDED NON-VOLATILE MEMORY

(75) Inventors: Tung-Cheng Kuo, I-Lan (TW); Shou-Wei Hwang, Chilung (TW); Chien-Hung Liu, Taipei (TW); Shyi-Shuh Pan, Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/003,320

(22) Filed: Dec. 6, 2001

(51) Int. Cl.[7] .......................................... H01L 21/8247
(52) U.S. Cl. ........................................................ 438/258
(58) Field of Search ................................. 438/258, 287, 438/786, 954

(56) References Cited

U.S. PATENT DOCUMENTS 6,258,667 B1 * 7/2001 Huang ........................ 438/258
6,346,442 B1 * 2/2002 Aloni et al. ................. 438/216

* cited by examiner

*Primary Examiner*—Richard Elms
*Assistant Examiner*—Beth E. Owens

(57) ABSTRACT

A method is described for forming a non-volatile memory comprising dividing a substrate into at least a memory array area and a logic device area. An oxide/nitride/oxide (ONO) layer is firstly formed on the substrate, and a photoresist layer is formed on the ONO layer by bit line photo process, and a bit line ion implantation process is performed on the substrate to form the plurality of bit lines structure. Then, a first polysilicon layer is deposited to form a plurality of word lines by word line photo condition. The complementary metal-oxide-semiconductor (CMOS) ONO layer is used to store the charge and the ONO layer is only touched by the photoresist layer once. Furthermore, the separated adjust photo condition of the memory array area and the logic device area can create a safe oxide thickness to solve the problem of leakage path between bit lines to bit lines by using a self-aligned silicide process.

15 Claims, 13 Drawing Sheets

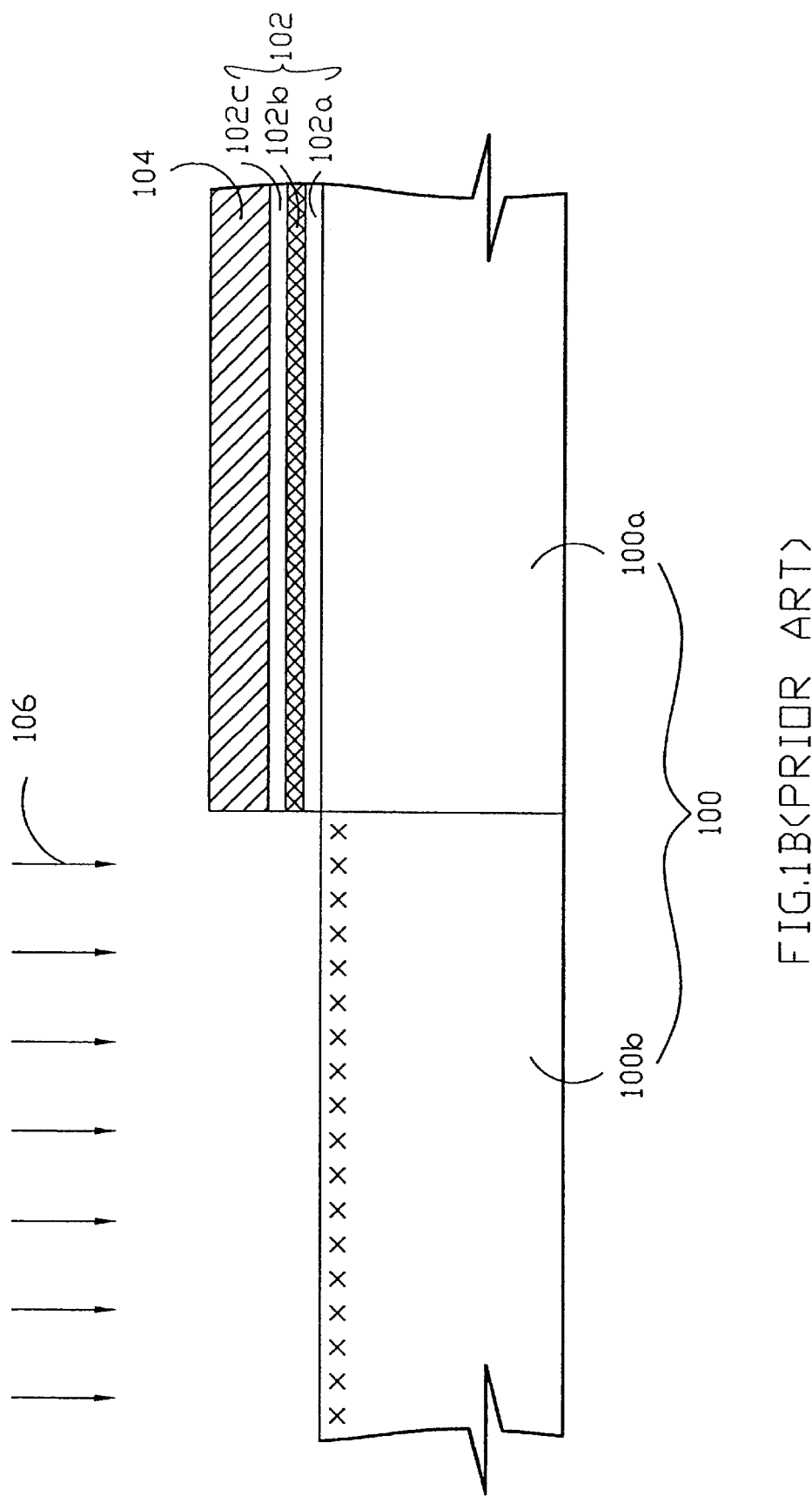

METHOD FOR FORMING EMBEDDED NON-VOLATILE MEMORY

BACKGROUND OF THE INVENTION

1. Field of the Invention

The present invention generally relates to a method for forming an embedded non-volatile memory, and more particularly to a method for forming an embedded non-volatile memory with double poly layer and double spacer.

2. Description of the Prior Art

Typical semiconductor memory utilized during microprocessor operation is volatile. That is in the case of power interruption, the data stored in the semiconductor memory is typically completely lost. One way to circumvent this problem is to provide separate backup of the memory, such as battery power or capacitor storage. An alternate technique is to make the memory fundamentally non-volatile. This option is highly desirable because non-volatile semiconductor memories would not only withstand, power interruption, but also would be stored or shipped without being energized.

Non-volatile memory devices are important for providing an advantage that random access memory (RAM), both dynamic and static, can't be provided. That is, non-volatile memory devices do not lose their memory even the power is turned off. RAM enables information to be both stored and read to a memory cell as dictated by a microprocessor. Read-only memory (ROM) is the most popular variety of non-volatile memory devices.

However, the flash memory is electrically re-programmable for a limited number of times. This makes it ideal for those applications where only a few changes in the programming of the system is for either the entire memory array or for blocks of it.

Besides, memory storage exists not only as stand-alone memory device, but also embedded in processor chips. The performance of an embedded flash can be better than other flash since bandwidth problems are reduced and interface circuit and package leads are eliminated. It can also have characteristic tailored to the specific application rather than being a standardized comprises between many factors such as high operating speed.

Referring to FIG. 1A, the substrate 100 is divided into at least a memory array area 100a and a logic device area 100b. An ONO layer (oxide/nitride/oxide layer) 102 is on the substrate 100. The conventional method for forming the first dielectric layer (tunneling oxide layer) 102a on the substrate 100 by thermal oxidation. However, the dielectric constant value of first 102a and second dielectric layer 102c is about 3.8 to 3.9 and thermal oxidation is a high temperature process. Then, a charge storage layer 102b such as silicon nitride (SiN) is formed on the first dielectric layer 102a by conventional CVD method (chemical vapor deposition method). Next, a second dielectric layer 102c is formed on the charge storage layer 102b by conventional CVD method. The material of first 102a and second dielectric layer 102c is silicon oxide. According to the hot electron injection phenomenon (HEI), some hot electrons penetrate through the bottom first dielectric layer 102a, especially when first dielectric layer 102a is thin enough, and electrons are therefore collected in charge storage layer 102b. Then, a photoresist layer is formed on the ONO layer 102 and a bit line structure is formed in the substrate 100 by using bit line ion implantation.

Then, referring to FIG. 1B, a photoresist layer 104 is formed on the second dielectric layer 102c. Then, an etching process is to remove the second dielectric layer 102c, charge storage layer 102b, and first dielectric layer 102a on logic device area 100b. Thereafter, a threshold voltage (Vt) region (not shown in FIG.) is formed on substrate 100 by ion implanting process 106. Because the second dielectric layer 102c is touched the photoresist layer 104 many times, the thickness of second dielectric layer 102c is to be thinned and the characteristic of second dielectric layer 102c is to be changed.

Then, referring to FIG. 1C, a gate oxide layer 108 is formed on the logic device area 100b, after the photoresist layer 104 is removed, and a polysilicon layer 110 is deposited on the memory array area 100a and logic device area 100b.

Referring to FIG. 1D, a plurality of word line is defined on the memory array area 100a and another photoresist layer (not shown) is formed on the polysilicon layer 110. Then, an etching process is performed on the polysilicon layer 110 to form the polysilicon gate electrode 110 on the memory array area 100a and on the logic device area 100b simultaneously.

Referring to FIG. 1E, a silicon oxide layer is deposited to fill the pitch between the polysilicon gate electrodes 110. Then, an etching-back process is performed on the silicon oxide layer to form spacers 112 on sidewalls of the polysilicon gate electrodes 110. Then, a self-aligned silicide process is formed over the polysilicon gate electrode 110.

Referring to FIG. 1F is a vertical view of the memory device. The horizontal lines connected to all the cells in the row are called the word lines 114a, 114b, 114c, and 114d, and the vertical lines along which the data flows into and out of the cells are called bit lines 116a, 116b, 116c, and 116d. The dotted line 120 is crosscut the word lines 114a, 114b, 114c, and 114d. Due to the thickness of the ONO layer 102 is too thin, thus, the silicide layer will pass through the ONO layer 102 to the substrate 100 in self-aligned silicide process such that the semiconductor device will not be operated.

According to above-mentioned description, the silicon oxide layer for forming separated spacers width between the polysilicon gate electrodes is not enough to create a safe oxide thickness so that the conduction film will be formed from self-aligned silicide process between the bit lines to bit lines and the leakage path is also occurred between the bit lines to the bit lines. And the most obvious limiting factor for an embedded flash memory is the relevant fabrication. In conventional fabrication, the transistors of the memory array area and the logic device area are formed simultaneously; therefore, the quality of the transistor of both memory array area and logic device area cannot be optimized at the same time. In other words, either performance of any transistors of the logic device area is degraded or reliability of any memory array area is degraded.

SUMMARY OF THE INVENTION

It is an object of this invention to provide a first polysilicon layer as a protective layer that is formed on the transistors of the memory array area to protect the ONO layer (oxide/nitride/oxide layer) from touches the photoresist layer in threshold voltage ion implantation on the logic device area.

It is another object of this invention to use a self-aligned silicide layer on the first polysilicon gate electrode on the memory array area as an etching-stop layer for etching the second polysilicon layer to form the second polysilicon gate electrode on the logic device area.

It is still another object of this invention to use a separated spacers width on the memory array area and on the logic device area to avoid the leakage path between the bit lines to the bit lines in a self-aligned silicide process.

In one embodiment, the present invention provides a method for forming an embedded non-volatile memory cell comprises the steps of providing a substrate and an ONO layer thereon. In the present invention, the ONO layer is formed earlier than the formation of the plurality of bit lines structure. Then, the first polysilicon layer is formed on the ONO layer. In order to get optimum process window, the transistor on the memory array area and on the logic device area are formed by two separated adjust photolithography conditions, and to avoid the leakage path between the bit lines to bit lines in a self-aligned silicide process. Furthermore, the separated spacers width between the polysilicon gate electrode on the memory array area and on the logic device area is filled by the oxide layer. Then, a second polysilicon layer is formed on the transistor of the memory array area and used as an insulation film to avoid the ONO layer on the memory array area that is touched by photoresist layer in threshold voltage ion implantation on the logic device area.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1B is a schematic diagram for showing an ion implantation process on the substrate in accordance with the prior art;

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
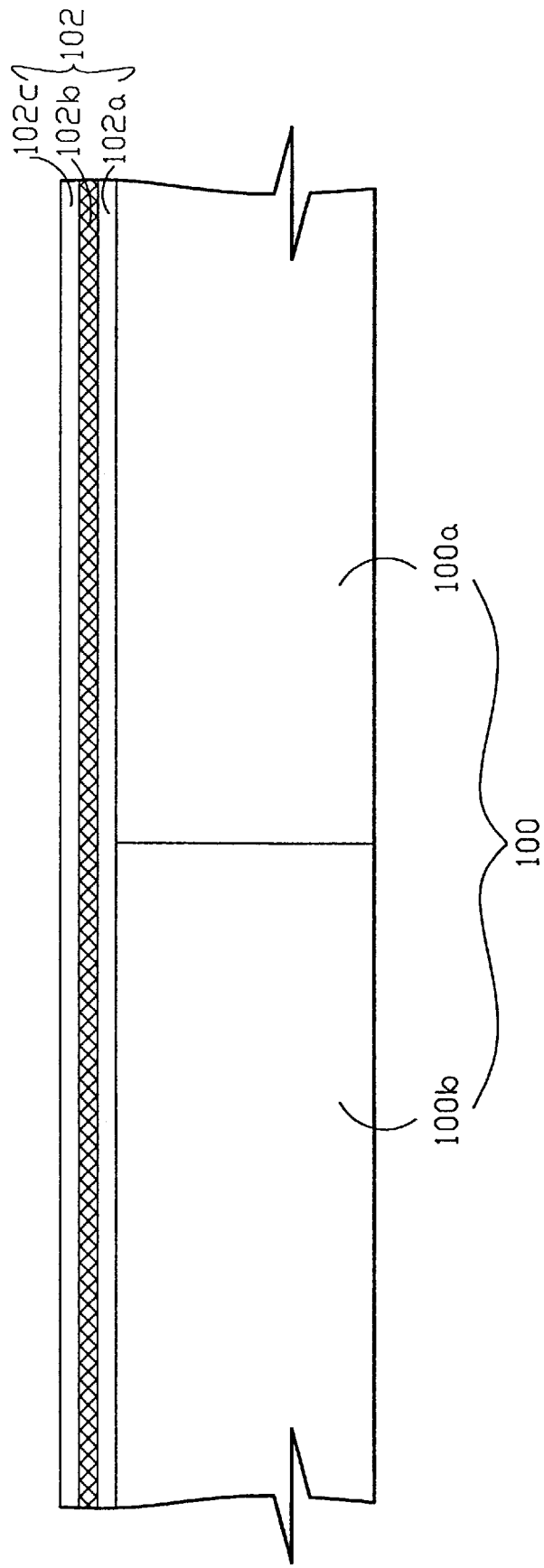
FIG. 1A is a schematic diagram for showing an ONO layer (oxide/nitride/oxide layer) on the substrate in accordance with the prior art.
Figure 1C:
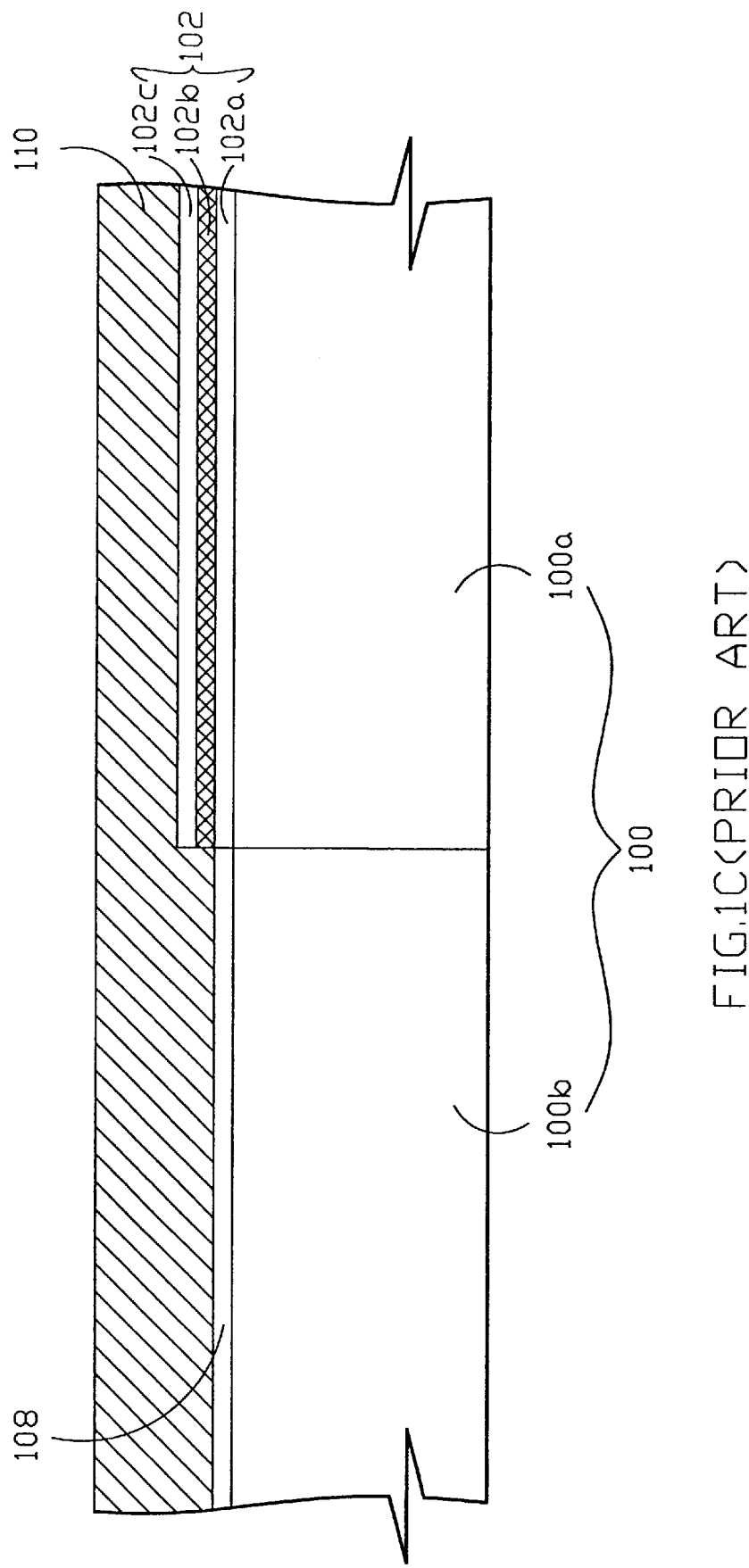
FIG. 1C is a schematic diagram for showing a polysilicon layer on the substrate in accordance with the prior art.
Figure 1D:
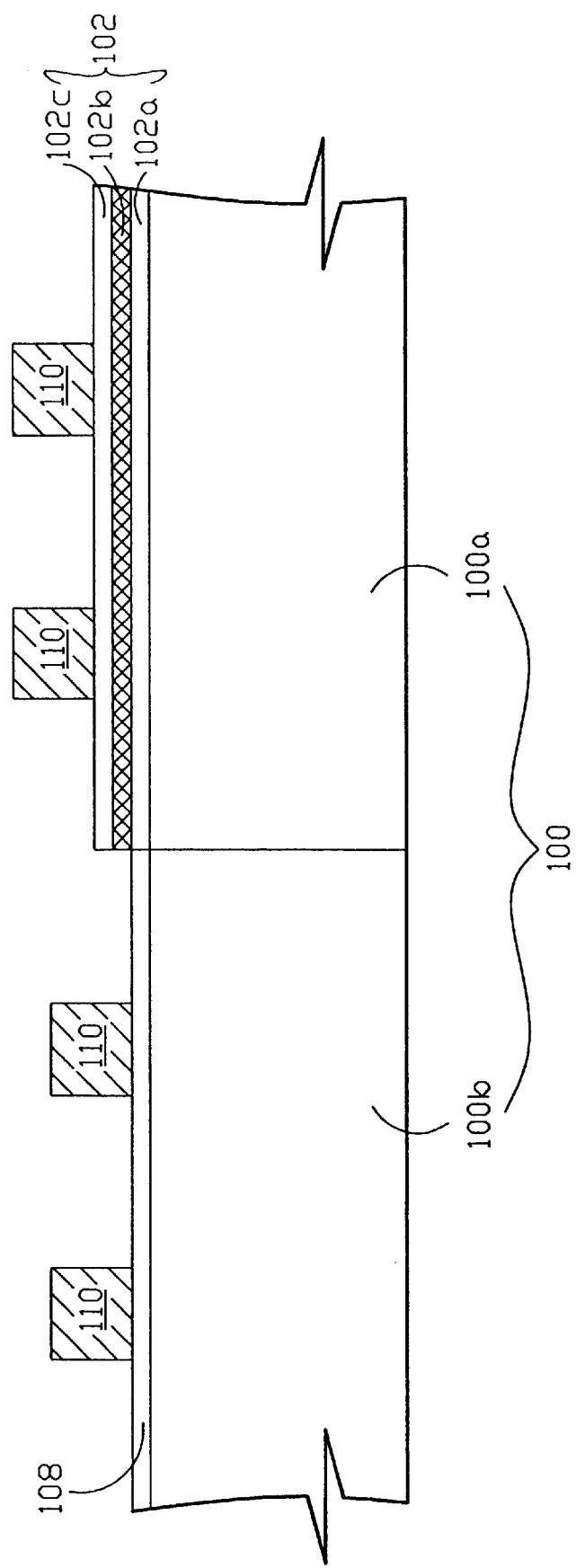
FIG. 1D is a schematic diagram for showing a formation of a polysilicon gate electrode on the memory array area and logic device area simultaneously in accordance with the prior art.
Figure 1E:
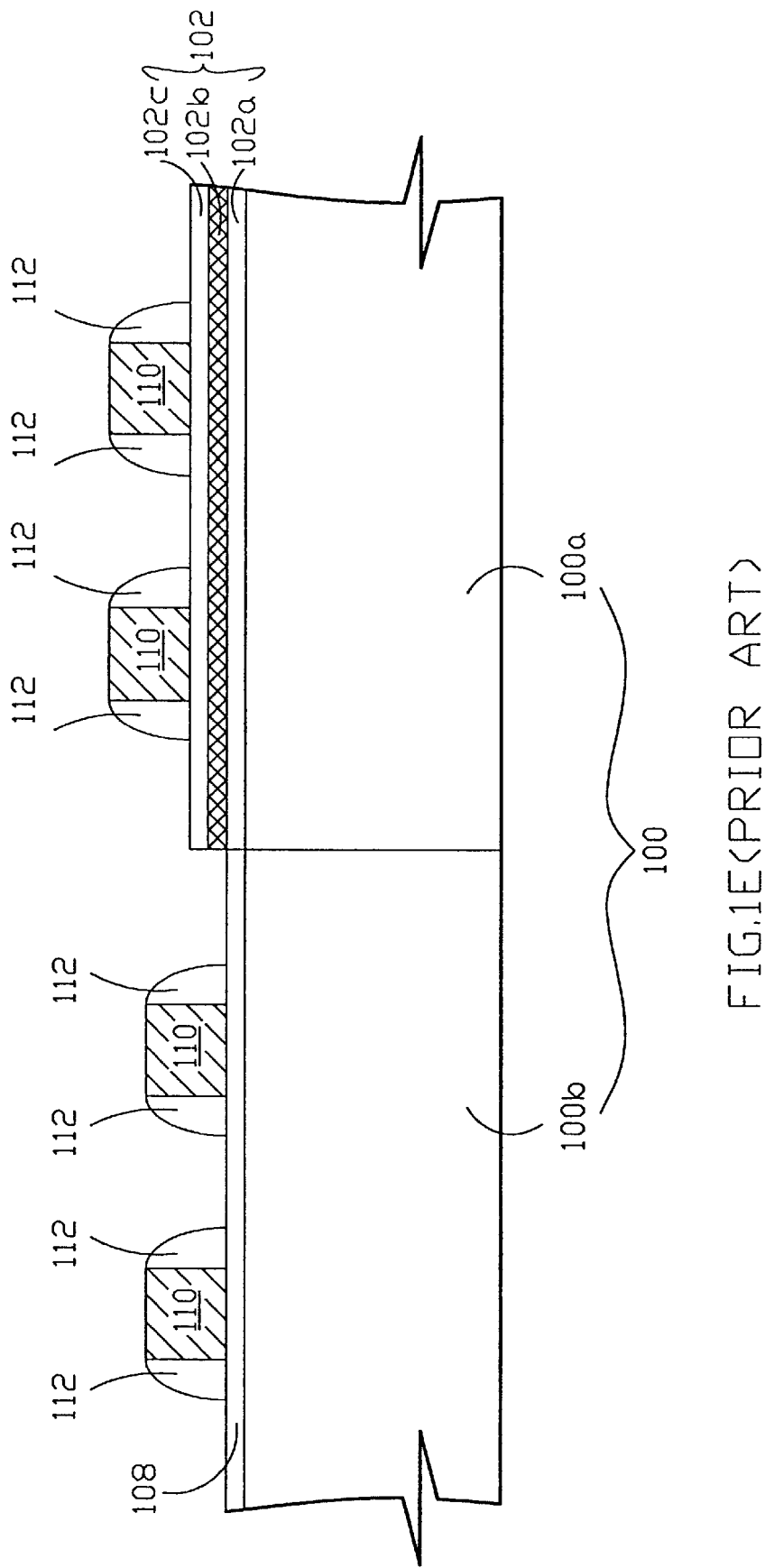
FIG. 1E is a schematic diagram for showing a transistor of memory array area and logic device area in accordance with the prior art.
Figure 1F:
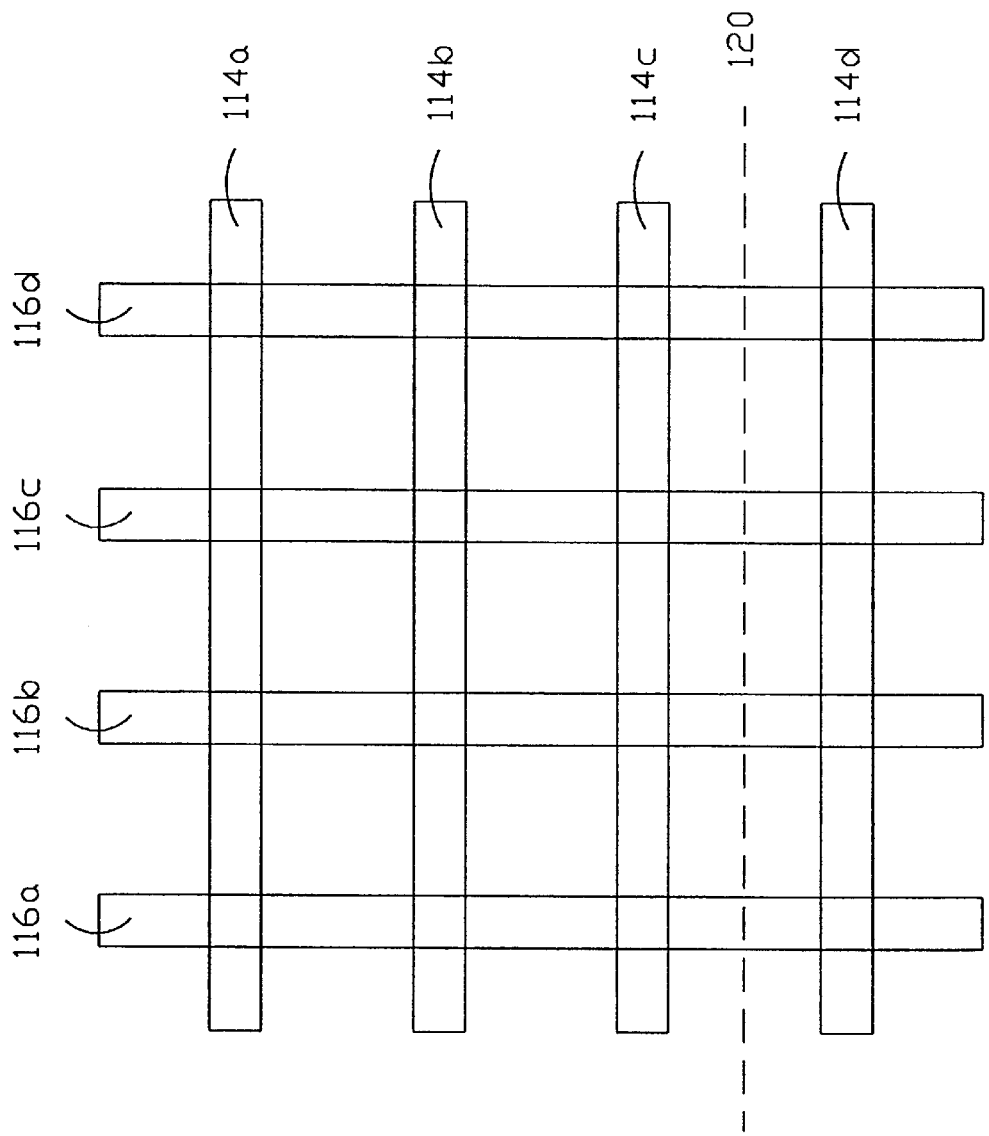
FIG. 1F is a schematic diagram of a vertical view of the plurality of word lines structure and the plurality of the bit lines structure within the memory device in accordance with the prior art.

The plurality of isolation devices (not shown) is formed on a substrate 10 before the ONO layer (oxide/nitride/oxide layer) 12. The plurality of isolation devices is used to separate the devices on the memory array area 10a, and on the logic device area 10b. Therefore, the substrate 10 is divided into at least two regions: the memory array area 10a and the logic device area 10b, wherein the logic device area 10b is adjacent to the memory array area 10a. The plurality of isolation devices is shallow trench isolation (STI) devices (not shown) within the substrate 10. To be worthy of the diagrams of the present invention, the cross-sectional view of the structure is in A–A' direction in array, thus, some devices, such as shallow trench isolation devices, within the semiconductor device that cannot represent in the Figures. The A–A' direction mentioned above is similar to the dotted line in FIG. 1F. Then, for forming the shallow trench isolation devices, a silicon nitride layer (not shown) and a photoresist layer (not shown) are subsequently formed on the substrate 10, and then a pattern of shallow trench isolation device is patterned to transfer into the photoresist layer by the conventional photolithography method. Next, by using the photoresist layer as a mask, the silicon nitride layer is etched to transfer the pattern of the shallow trench isolation devices thereto. Following, the substrate 10 is etched to form a plurality of trench by using conventional etching method. Next, a silicon oxide layer is filled into the plurality of trenches and oxidized by thermal oxidation method, which followed by removing the photoresist layer and silicon nitride layer.

Figure 2A:
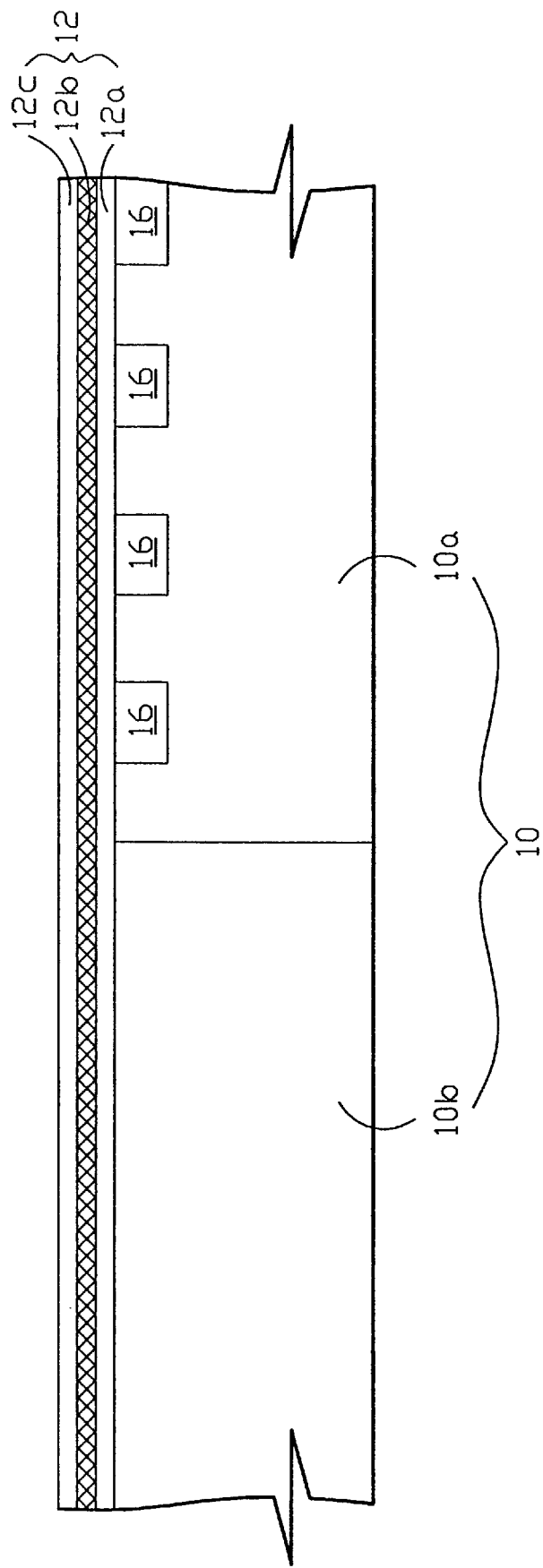
FIG. 2A is a schematic diagram for showing an ONO layer (oxide/nitride/oxide layer) on the substrate in accordance with a method disclosed herein.
Figure 2B:
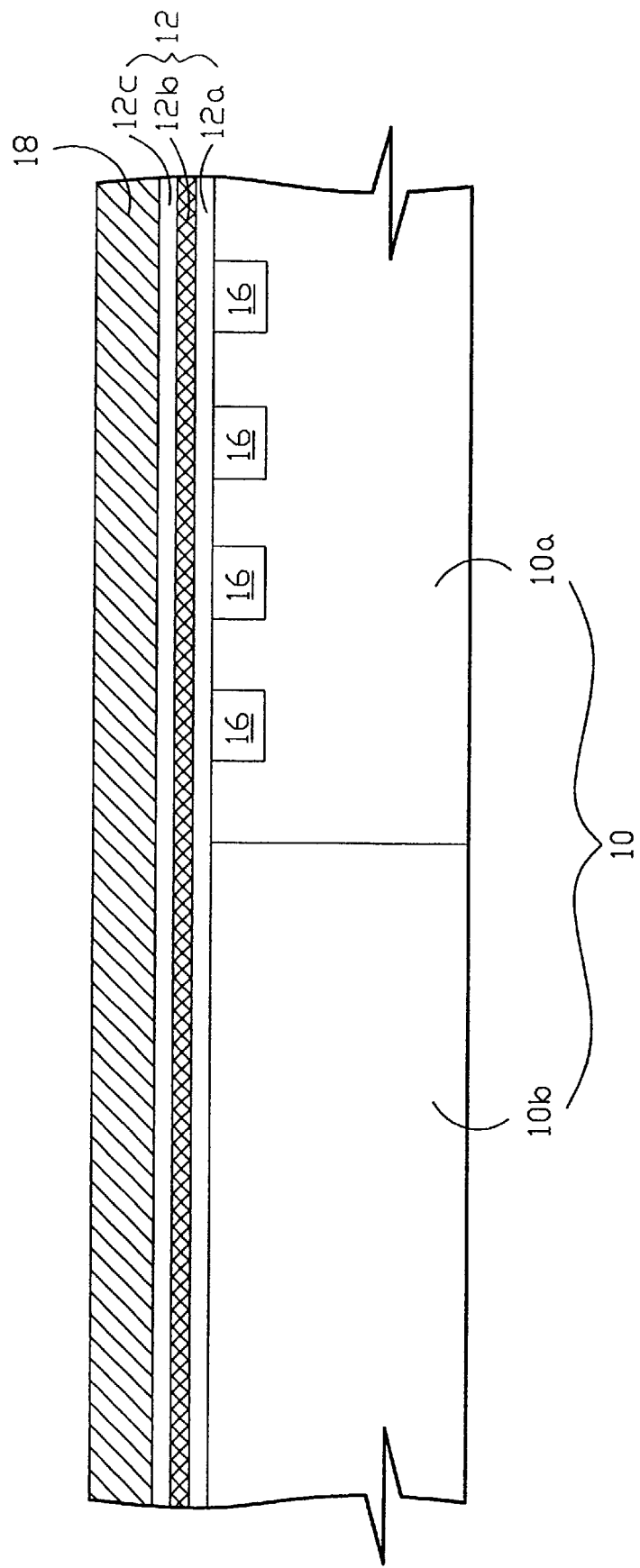
FIG. 2B is a schematic diagram for showing a first polysilicon layer on the structure of FIG. 2A in accordance with a method disclosed herein.

Referring to FIG. 2A and FIG. 2B, an ONO layer (oxide/nitride/oxide layer) 12 with thickness about 200 angstroms is deposited to form nitride read-only memory (NROM). For the formation of the structure of ONO layer 12, a bottom-side silicon oxide layer 12a (tunneling oxide) as a first dielectric layer, a silicon nitride 12b as a charge storage layer, and a topside silicon oxide layer 12c as a second dielectric layer. The silicon oxide layer 12a, silicon nitride layer 12b, and topside silicon oxide layer 12c are sequentially formed on the substrate 10. The silicon oxide layer 12a is formed by thermal oxidation method, which is a high temperature process. The charge storage layer 12b is formed by conventional CVD (chemical vapor deposition) method. The charge storage layer 12b provides the charge retention mechanism for programming the memory cell, and then a topside silicon oxide layer 12c is deposited on the charge storage layer 12b by conventional CVD method or thermal oxidation method. Then, a photoresist layer is formed on the ONO layer 12 and a plurality of bit lines structure 16 is formed on the memory array area 10a by using bit line ion implantation. In the present invention, the plurality of bit lines structure showing the A–A' direction in array in the FIG. 2A. Then, a first polysilicon layer 18 is deposited on the ONO layer 12 as shown in FIG. 2B. Next, a plurality of word lines structure is defined on the memory array area 10a and another photoresist layer (not shown) is formed on the first polysilicon layer 18. Thereafter, an etching process is performed on the first polysilicon layer 18 to form the first polysilicon gate electrode 18a on the ONO layer 12, and the portion of the first polysilicon layer 18 on the logic device area 10b is also removed.

Figure 2C:
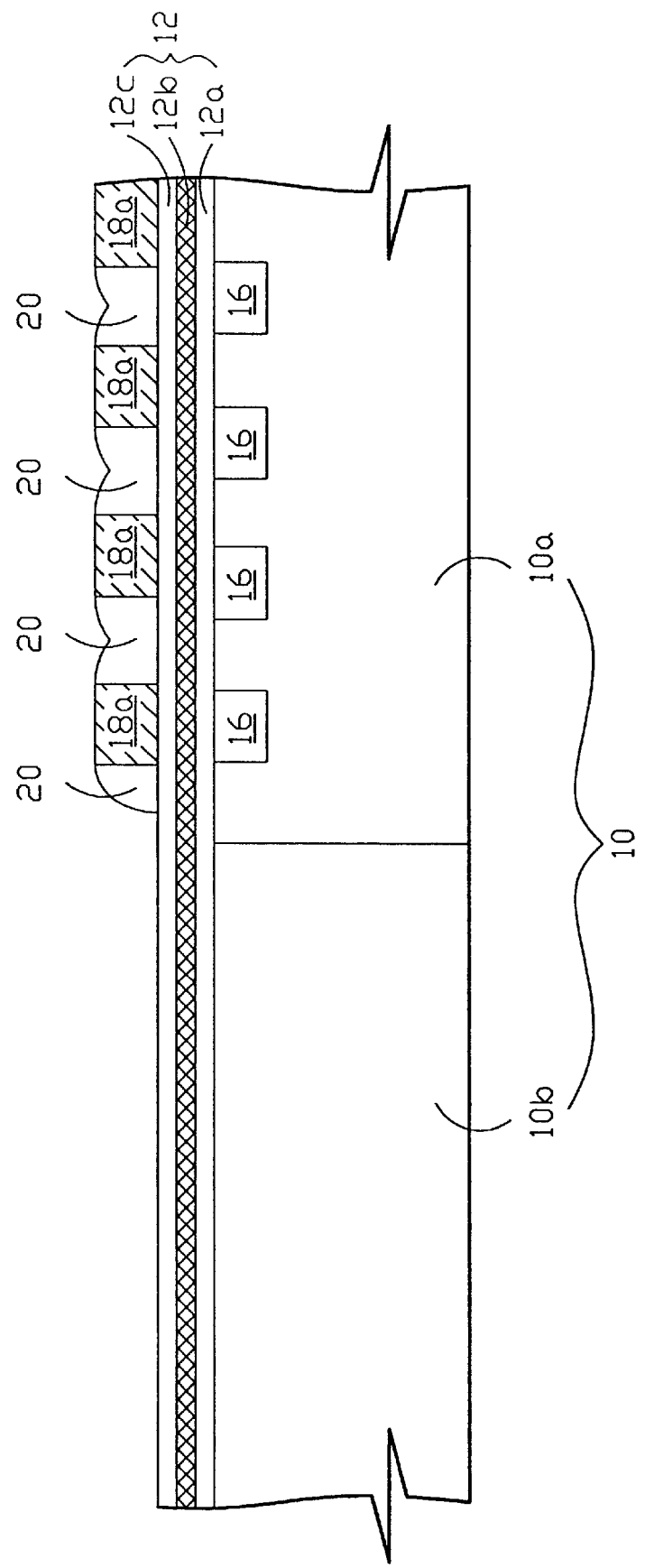
FIG. 2C is a schematic diagram for showing a transistor of memory array area on the structure of FIG. 2B in accordance with a method disclosed herein.
Figure 2D:
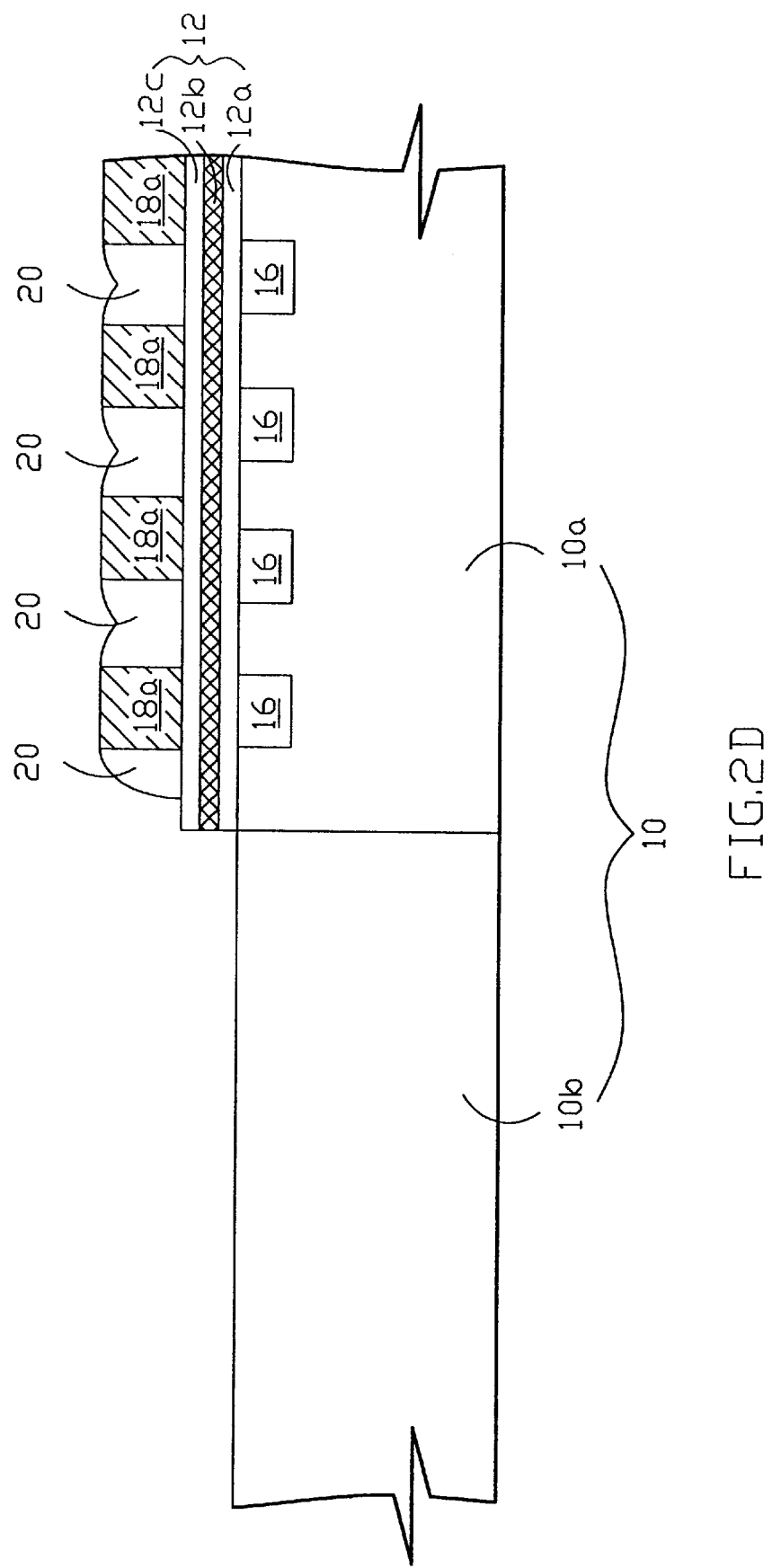
FIG. 2D is a cross-sectional view of showing the ONO layer on the logic device area is removed in accordance with a method disclosed herein.

Then, referring to FIG. 2C to FIG. 2D, the first spacers 20 are on sidewalls of the first polysilicon gate electrodes 18a on the memory array area 10a. For forming the first spacers 20, an oxide layer as the third dielectric layer is deposited to fill the pitch between the first polysilicon gate electrodes 18a on the memory array area 10a. Then, the oxide layer is etched back to form the first spacers 20 on the sidewalls of the first polysilicon gate electrodes 18a on the memory array area 10a. Then, the thickness of oxide layer (third dielectric layer) can be adjusted after the deposition process to let the pitch between the first polysilicon gate electrodes 18a can be filled by first spacers 20. Thereafter, the ONO layer 12 on the logic device area 10b is removed by RIE (Reactive Ion Etching) method (as shown in FIG. 2D).

Figure 2E:
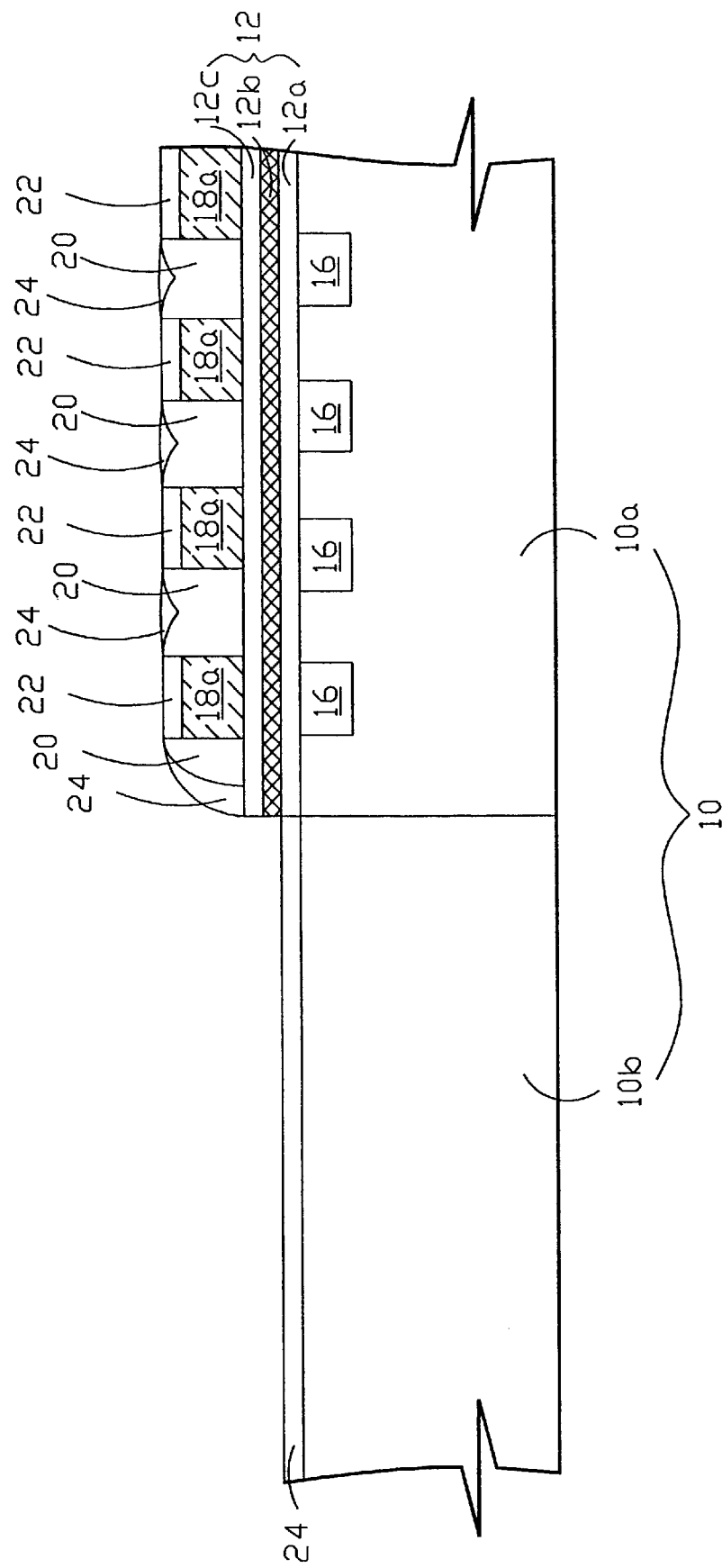
FIG. 2E is a schematic diagram for showing a gate oxide layer on structure of FIG. 2D on the memory array area in accordance with a method disclosed herein.
Figure 2F:
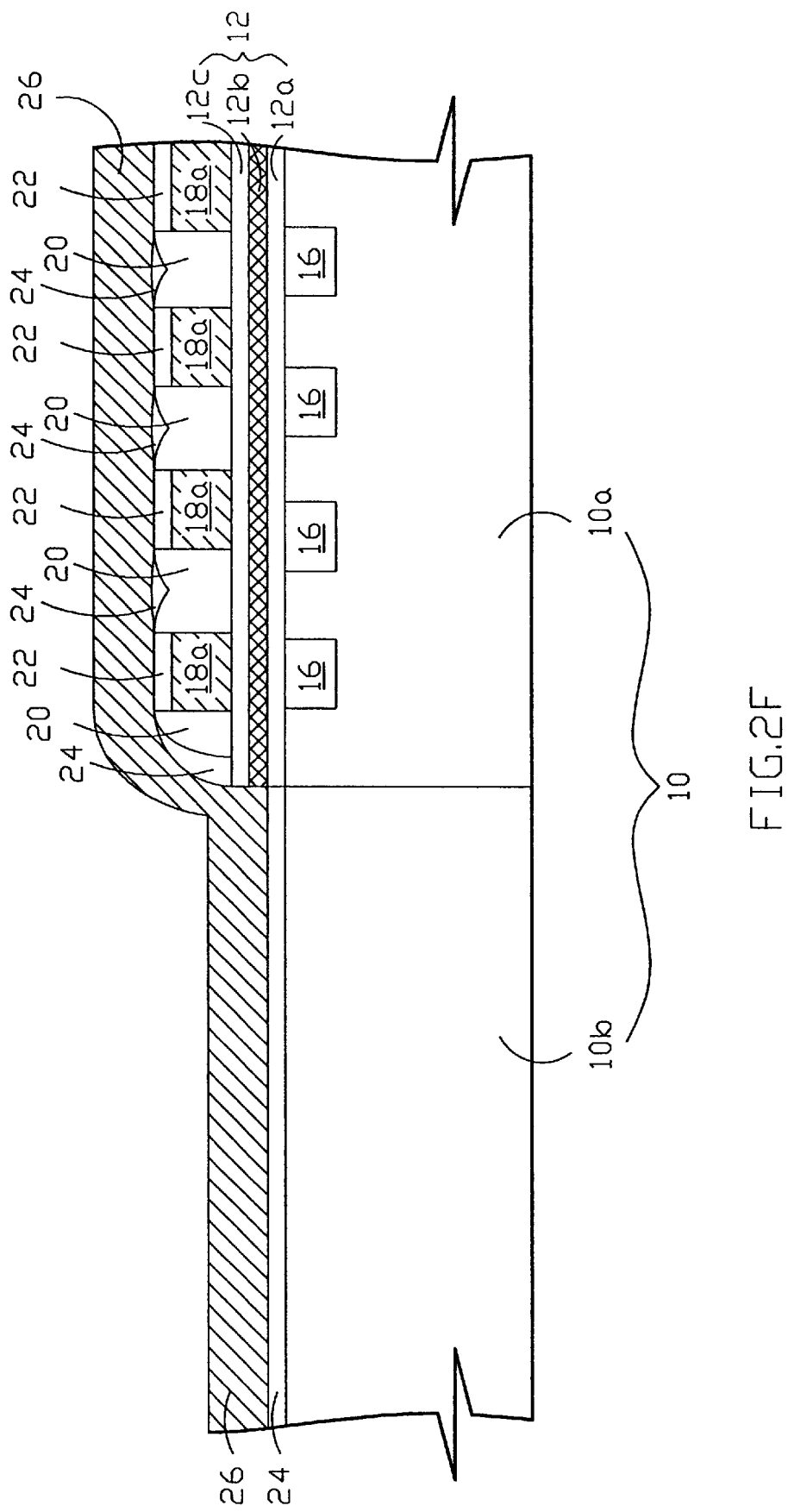
FIG. 2F is a schematic diagram for showing a second polysilicon layer on structure of FIG. 2E in accordance with a method disclosed herein.
Figure 2G:
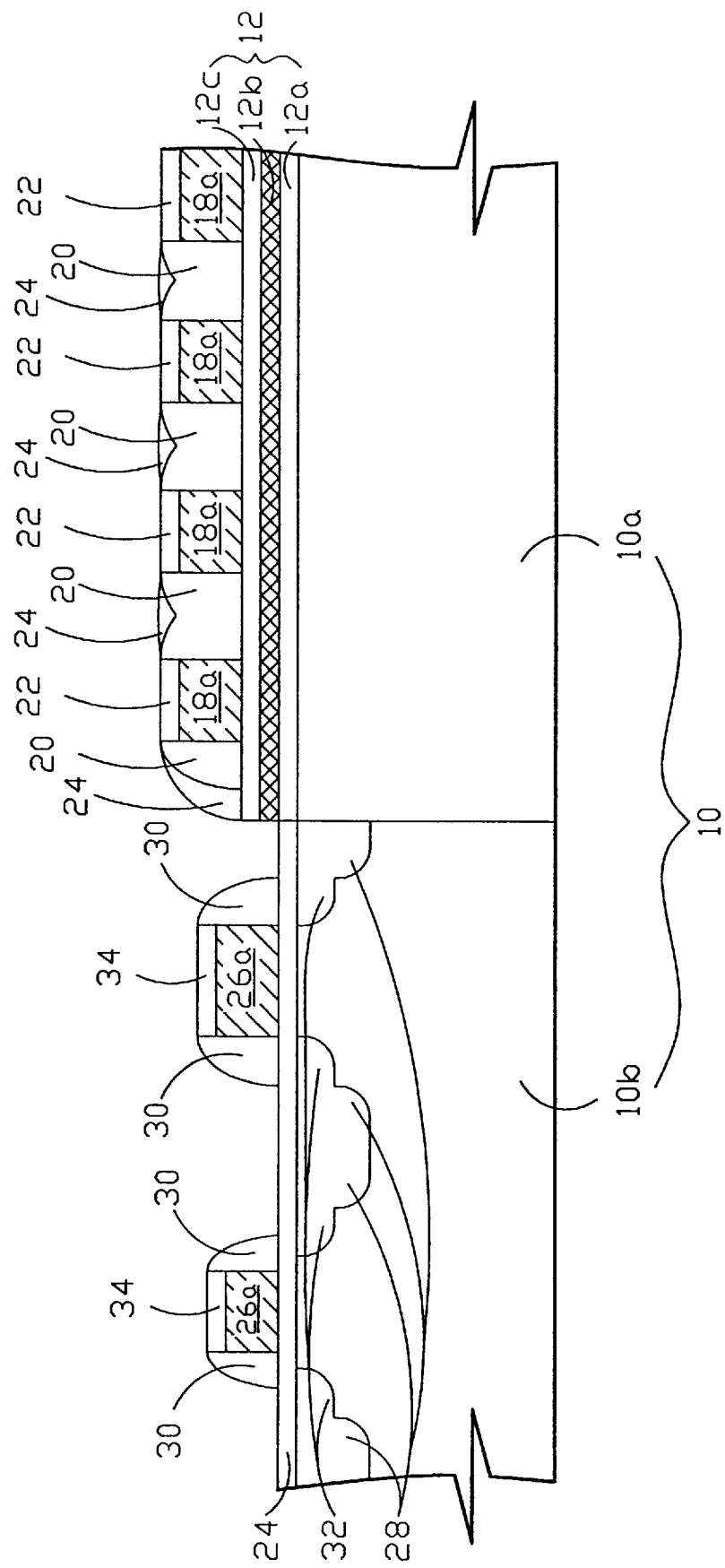
FIG. 2G is a schematic diagram for showing a transistor of the logic device area is formed on the structure of FIG. 2F in accordance with a method disclosed herein.

Referring to FIG. 2E to FIG. 2G, the threshold voltage ion-implanting region is formed on the logic device area 10b, and then a fourth dielectric layer is deposited on the logic device area 10b as a gate oxide layer 24 and is on the first spacers 20 to add the thickness of the first spacers 20 and as a protective layer for first polysilicon gate electrode 18a. Then, a self-aligned silicide process is performed on the first polysilicon gate electrodes 18a to form a silicide layer 22 over the first polysilicon gate electrodes 18a. Then, as shown in FIG. 2F, a second polysilicon layer 26 is formed on both of the gate oxide layer 24 and on the first polysilicon gate electrode 18a that used as an insulation film. The second spacers 24 on the first spacer 20 is used as an etching-stop layer for etching the second polysilicon layer 26 in subsequently process. Thereafter, a second photoresist layer is deposited, exposed, and developed on the second polysilicon layer 26 on the logic device area 10b by the use of well-known photolithography techniques, where the second photoresist layer is also covered on the memory array area 10a. Then, an etching process is performed on the second polysilicon layer 26 to form a second polysilicon gate electrodes 26a on the gate oxide layer 24 on the logic device area 10b, and the portion of second polysilicon layer 26 is removed, wherein the plurality of pitch width between the second polysilicon gate electrodes 26a is not equivalent and has a suitable spacers width to fill up the fifth dielectric layer on the logic device area 10b in subsequently process. Then, the lightly doped drain region 28 which showed in B–B' direction in array as shown in FIG. 2G, and is formed below the gate oxide layer 24 on the logic device area 10b. Next, a fifth dielectric layer is deposited to fill the plurality of pitch between the second polysilicon gate electrodes 26a on the logic device area 10b and an etching-back process is performed on the fifth dielectric layer to form the third spacers 30 on the sidewalls of the second polysilicon gate electrodes 26a (as shown in FIG. 2G). Thereafter, the source/drain 32 region in the B–B' direction is formed by conventional ion implantation method on the logic device area 10b. Finally, referring to FIG. 2G, a self-aligned silicide process is performed on the second polysilicon gate electrode 26a to form a silicide layer 34 on the second polysilicon gate electrode 26a on logic device area 10b.

According to above-mentioned description, the advantages for the present invention is that the first polysilicon layer and the plurality of word lines structure is firstly formed to avoid the ONO layer that is touched the photoresist layer many times during the CMOS (complementary-metal-oxide-semiconductor) process. The ONO layer on the memory array area can be avoided to touch the photoresist layer to change the characteristic or thickness for ONO layer. The formation of transistors on the memory array area and on the logic device area is divided two photolithography processes that can adjust the photo conditions separately for the memory array area and the logic device area to get optimum process window in subsequently process. Furthermore, the separated spacers width on the memory array area and logic device area can avoid the leakage path between the bit lines to the bit lines in a self-aligned silicide process.

Although specific embodiments have been illustrated and described, it will be obvious to those skilled in the art that various modifications may be made without departing from what is intended to be limited solely by the appended claims.

What is claimed is:

1. A method for forming an embedded non-volatile memory, said method comprising:

providing a substrate having a memory array area and a logic device area;

sequentially depositing a first dielectric layer on said substrate, a charge storage layer on said first dielectric layer, and a second dielectric layer on said charge storage layer;

performing a bit line ion implantation process through said second dielectric layer, said charge storage layer, and said first dielectric layer to form a plurality of bit lines structure in said substrate;

depositing a polysilicon layer on said second dielectric layer;

etching said polysilicon layer to form a polysilicon gate electrode and to define a plurality of word lines structure on said memory array area to protect said first dielectric layer, said charge storage layer, and said second dielectric layer such that direct contact between said first dielectric layer, said charge storage layer, and said second dielectric layer and photoresist layers can be reduced;

forming spacers between said plurality of word lines structure to fill pitch therebetween;

removing said first dielectric layer, said charge storage layer, and said second dielectric layer on said logic device area;

forming a third dielectric layer over said plurality of word lines structure; and forming a metal-oxide-semiconductor transistor on said logic device area.

2. The method according to claim 1, wherein the material of said first dielectric layer, said second dielectric layer, and said third dielectric layer comprises silicon oxide.

3. The method according to claim 2, wherein the material of said charge storage layer comprises silicon nitride.

4. The method according to claim 1, further comprising a step of forming a threshold voltage region by ion implantation.

5. The method according to claim 1, further comprising a self-aligned silicide process performed on said memory array area and on said logic device area.

6. A method for forming an embedded non-volatile memory, said method comprising:

providing a substrate having a memory array area and a logic device area;

sequentially depositing a first dielectric layer on said substrate, a charge storage layer on said first dielectric layer, and a second dielectric layer on said charge storage layer;

performing a bit line ion implantation process through said second dielectric layer, said charge storage layer, and said first dielectric layer to form a plurality of bit lines structure in said substrate;

depositing a first polysilicon layer on said second dielectric layer;

etching said first polysilicon layer to form a first polysilicon gate electrode and to define a plurality of word lines structure on said memory array area to protect said first dielectric layer, said charge storage layer, and said second dielectric layer such that direct contact between said first dielectric layer, said charge storage layer, and said second dielectric layer and photoresist layers can be reduced;

forming first spacers between said plurality of word lines structure to fill pitch therebetween;

removing said first dielectric layer, said charge storage layer, and said second dielectric layer on said logic device area;

forming a third dielectric layer over said plurality of word lines structure and on said logic device area;

forming a metal-oxide-semiconductor transistor on said logic device area; and performing a self-aligned silicide process on said memory array area and on said logic device area.

7. The method according to claim 6, wherein the material of said first dielectric layer, said second dielectric layer, and said third dielectric layer comprises silicon oxide.

8. The method according to claim 7, wherein the material of said charge storage layer comprises silicon nitride.

9. The method according to claim 6, further comprising a step of forming a threshold voltage region by ion implantation.

10. The method according to claim 6, further comprising a second polysilicon layer deposited on said memory array and on said logic device area.

11. The method according to claim 6, wherein said metal-oxide-semiconductor transistor comprises a gate oxide layer, a second polysilicon gate electrode on said gate oxide layer, and second spacers on sidewalls of said second polysilicon gate electrode.

12. A method for forming an embedded non-volatile memory, said method comprising:

providing a substrate having a memory array area and a logic device area;

sequentially depositing a first dielectric layer on said substrate, a charge storage layer on said first dielectric layer, and a second dielectric layer on said charge storage layer;

performing a bit line ion implantation process through said second dielectric layer, said charge storage layer, and said first dielectric layer to form a plurality of bit lines structure in said substrate;

depositing a first polysilicon layer on said second dielectric layer;

etching said first polysilicon layer to form a first polysilicon gate electrode and to define a plurality of word lines structure on said memory array area to protect said first dielectric layer, said charge storage layer, and said second dielectric layer such that direct contact between said first dielectric layer, said charge storage layer, and said second dielectric layer and photoresist layers can be reduced;

forming first spacers between said plurality of word lines structure to fill pitch therebetween;

removing said first dielectric layer, said charge storage layer, and said second dielectric layer on said logic device area;

forming a third dielectric layer on said logic device area and over said plurality of word lines structure, wherein the third dielectric layer increases the thickness of said first spacers to form second spacers on sidewalls of the first polysilicon gate electrode;

depositing a second polysilicon layer on said third dielectric layer and said memory array area;

patterning to etch said second polysilicon layer to form a second polysilicon gate electrode on said logic device area;

forming a lightly doped drain region on said logic device area;

forming third spacers on sidewalls of said second polysilicon gate electrode on said logic device area;

forming a source/drain region adjacent said lightly doped drain region; and performing a self-aligned silicide process on said logic device area and on said memory array area.

13. The method according to claim 12, wherein the material of said first dielectric layer, said second dielectric layer, and said third dielectric layer comprises silicon oxide.

14. The method according to claim 13, wherein the material of said charge storage layer comprises silicon nitride.

15. The method according to claim 12, further comprising step of forming a threshold voltage region by ion implantation.

* * * * *